(12) United States Patent
Bhoja et al.

(10) Patent No.: US 6,934,869 B1
(45) Date of Patent: Aug. 23, 2005

(54) METHOD AND APPARATUS FOR ELIMINATING DEAD ZONE IN PHASE LOCKED LOOPS USING BINARY QUANTIZED PHASE DETECTORS

(75) Inventors: Sudeep Bhoja, San Jose, CA (US); John S. Wang, Sunnyvale, CA (US); Chris R. Cole, Redwood City, CA (US)

(73) Assignee: Big Bear Networks, Inc., Milpitas, CA (US)

( * ) Notice: Subject to any disclaimer, the term of this patent is extended or adjusted under 35 U.S.C. 154(b) by 691 days.

(21) Appl. No.: 09/954,453

(22) Filed: Sep. 12, 2001

(51) Int. Cl.$^7$ .............. G06F 1/04; H03D 3/24
(52) U.S. Cl. ............ 713/500; 713/503; 375/376
(58) Field of Search ................ 713/500, 503, 713/600; 375/376; 327/156, 161

(56) References Cited

U.S. PATENT DOCUMENTS

| | | | | |
|---|---|---|---|---|
| 4,019,153 A | * | 4/1977 | Cox et al. ............... 331/1 A |
| 4,827,225 A | * | 5/1989 | Lee ......................... 331/10 |
| 4,853,642 A | * | 8/1989 | Otani et al. ............. 329/306 |
| 5,012,494 A | * | 4/1991 | Lai et al. ................ 375/376 |
| 5,473,639 A | * | 12/1995 | Lee et al. ............... 375/376 |
| 5,940,609 A | * | 8/1999 | Harrison ................ 713/503 |
| 6,347,128 B1 | * | 2/2002 | Ransijn ................... 375/376 |
| 6,362,670 B1 | * | 3/2002 | Beaulieu ................. 327/156 |
| 6,480,047 B2 | * | 11/2002 | Abdel-Maguid et al. ..... 327/161 |
| 6,526,112 B1 | * | 2/2003 | Lai ......................... 375/376 |
| 6,741,668 B1 | * | 5/2004 | Nakamura ............... 375/376 |

FOREIGN PATENT DOCUMENTS

JP 60-62706 * 4/1985

* cited by examiner

Primary Examiner—Chun Cao

(57) ABSTRACT

A method and apparatus for eliminating dead zone in a phase locked loop with binary quantized detectors are described. Dead zone can be eliminated by changing the threshold used to quantize the cross point sample. A quantized cross point sample is integrated in order to set a new threshold. The integration may be performed during data transitions to eliminate threshold drift during long sequences where no transitions occur.

13 Claims, 6 Drawing Sheets

METHOD AND APPARATUS FOR ELIMINATING DEAD ZONE IN PHASE LOCKED LOOPS USING BINARY QUANTIZED PHASE DETECTORS

BACKGROUND INFORMATION

1. Field of Invention

The invention relates generally to phase locked loops, particularly to the elimination of dead zone for phase locked loops using binary quantized phase detectors.

2. Description of Related Art

Clock recovery circuits (CRC) are often used in communication systems and other electronic systems to synchronize a local clock to an external system clock. Currently, a phase locked loop (PLL) is the standard approach to constructing a CRC.

FIG. 1 shows a conventional phase locked loop, including the basic components: a phase and frequency detector denoted 1, a low pass filter (LPF) denoted 3, and a voltage-controlled oscillator (VCO) denoted 5.

The phase and frequency detector 1 compares a reference signal denoted 7 to a feedback signal denoted 11 in order to produce a phase error signal denoted 9. The phase error signal 9 is then filtered through the low pass filter 3 and subsequently input to the VCO 5. The VCO 5 generates a signal 11 with a frequency controlled by the filtered phase error signal. The output 11 is fed back into the phase and frequency detector 1. If the two frequencies for the signals 7 and 11 do not equal, the filtered phase error signal would cause the VCO 5 to shift to the frequency of the reference signal 7. When the shift is completed, the output of the VCO 5 is used as the synchronized signal.

Several types of phase locked loops have been developed using phase detectors such as Alexander phase detector and Hogge phase detector. Particularly, the Alexander phase detector has been widely adopted due to its ease of implementation.

A CRC measures the clock phase and aligns it to the reference clock to minimize bit-error-rate, and the optimum sampling instant is at the center of the data-eye. FIG. 2 illustrates a data-eye diagram with two data-eyes having centers denoted 17 and 19 and a cross point denoted 13. An Alexander phase detector uses the cross point 13 sample as a reference to locate the data-eye centers.

However, due to duty cycle distortion, the cross point 13 in FIG. 2 is offset from the threshold 0 by a dead zone denoted 15. The duty-cycle distortion causes an Alexander phase detector to wander in the interval denoted 14, searching for the cross point, thereby offsetting the locations of the data-eye centers 17 and 19.

SUMMARY OF THE INVENTION

The present invention provides the method and apparatus for eliminating dead zone in a phase lock loop using a binary quantized phase detector. The present invention allows a binary quantized phase detector to locate a cross point in a data-eye diagram by gradually shifting a threshold value towards the threshold at which a cross point occurs.

In a first embodiment of the present invention, a binary quantized phase detector first receives a signal sampled in a wandering interval caused by duty-cycle distortion, and compares the value of the signal to a threshold value. The binary result of the comparison is then level shifted and subsequently integrated. The output of the integration is set as the new threshold and the process to locate the cross point restarts with the new threshold.

In a second embodiment of the present invention, the integration step takes place only when the data sequence transitions.

BRIEF DESCRIPTION OF THE DRAWINGS

The accompanying drawings that are incorporated in and form a part of this specification illustrate embodiments of the invention and together with the description, serve to explain the principles of the invention.

DETAILED DESCRIPTION

Figure 3:
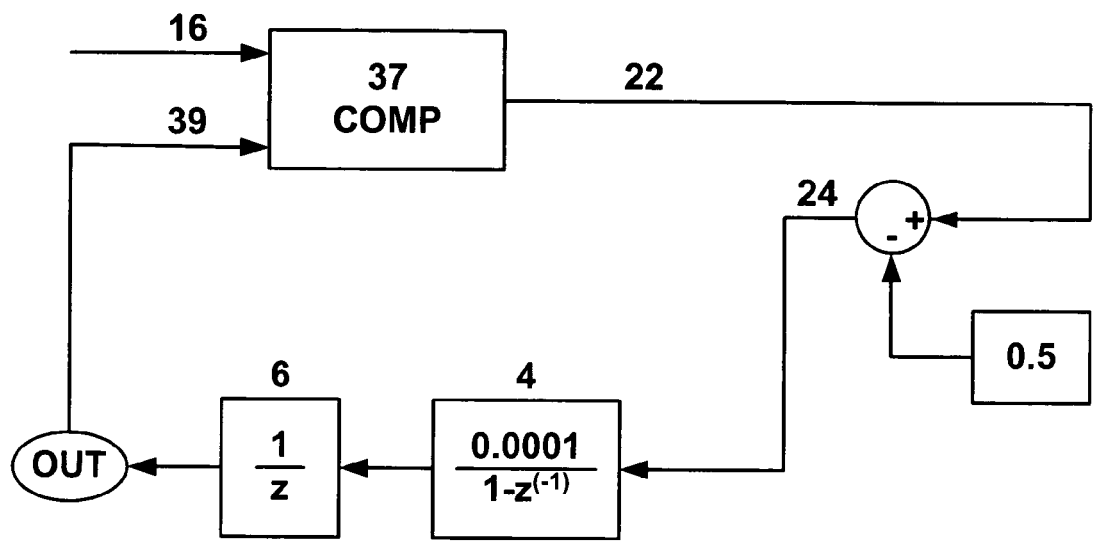
FIG. 3 illustrates a first embodiment of the present invention that integrates quantized values sampled in the wandering interval.

FIG. 3 illustrates a set-threshold circuit 100 used to locate a cross point in a data-eye diagram, comprising: a comparator 37 with two inputs 16 and 39 and an output 22, an integrator block 4, and a unit delay block 6.

The first embodiment shown in FIG. 3 sets 0 as the default starting value for the threshold value 39. Referring now to FIG. 3 in view of FIG. 2, the phase detector first takes a sample 16 in the wandering interval denoted 14 in FIG. 2 and compares the value of the sample with the threshold value 39; the comparison returns an output 22 of 0 if the comparison result is FALSE and an output 22 of 1 if the comparison result is TRUE. The binary output 22 is then subtracted by 0.5 to obtain an average output value of 0; the resulting value 24 is integrated in the integrator block denoted 4.

Moreover, the scale factors such as 0.0001 in FIG. 3 are selected in the integration equation as the amount to shift the threshold value of the phase detector up or down, and the value may vary depending on the desired precision with which the detector uses to locate a cross point in the data-eye diagram.

Figure 1:
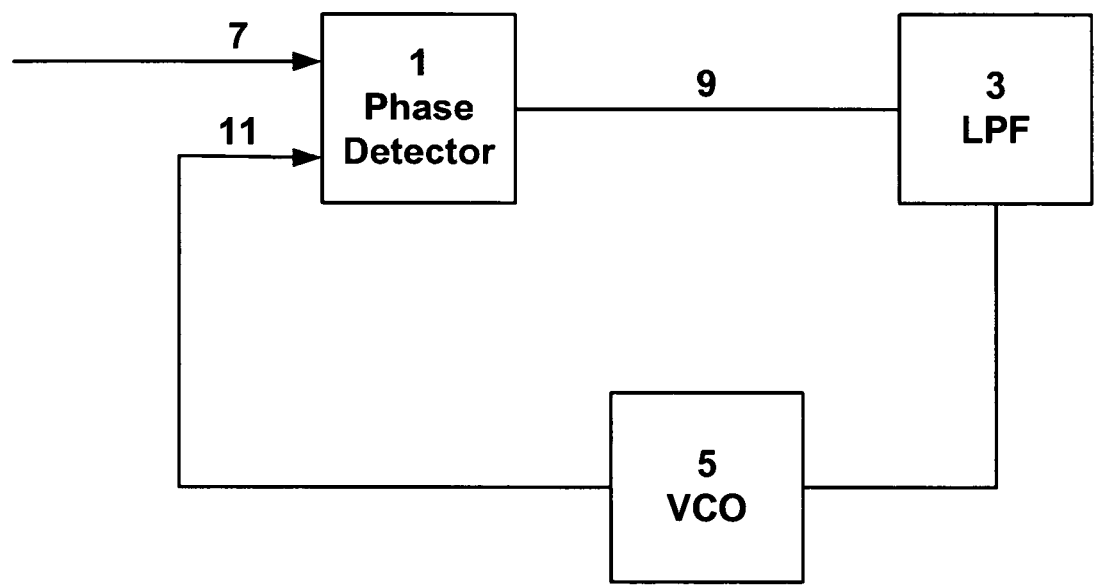
FIG. 1 illustrates a prior art phase locked loop with basic components.
Figure 2:
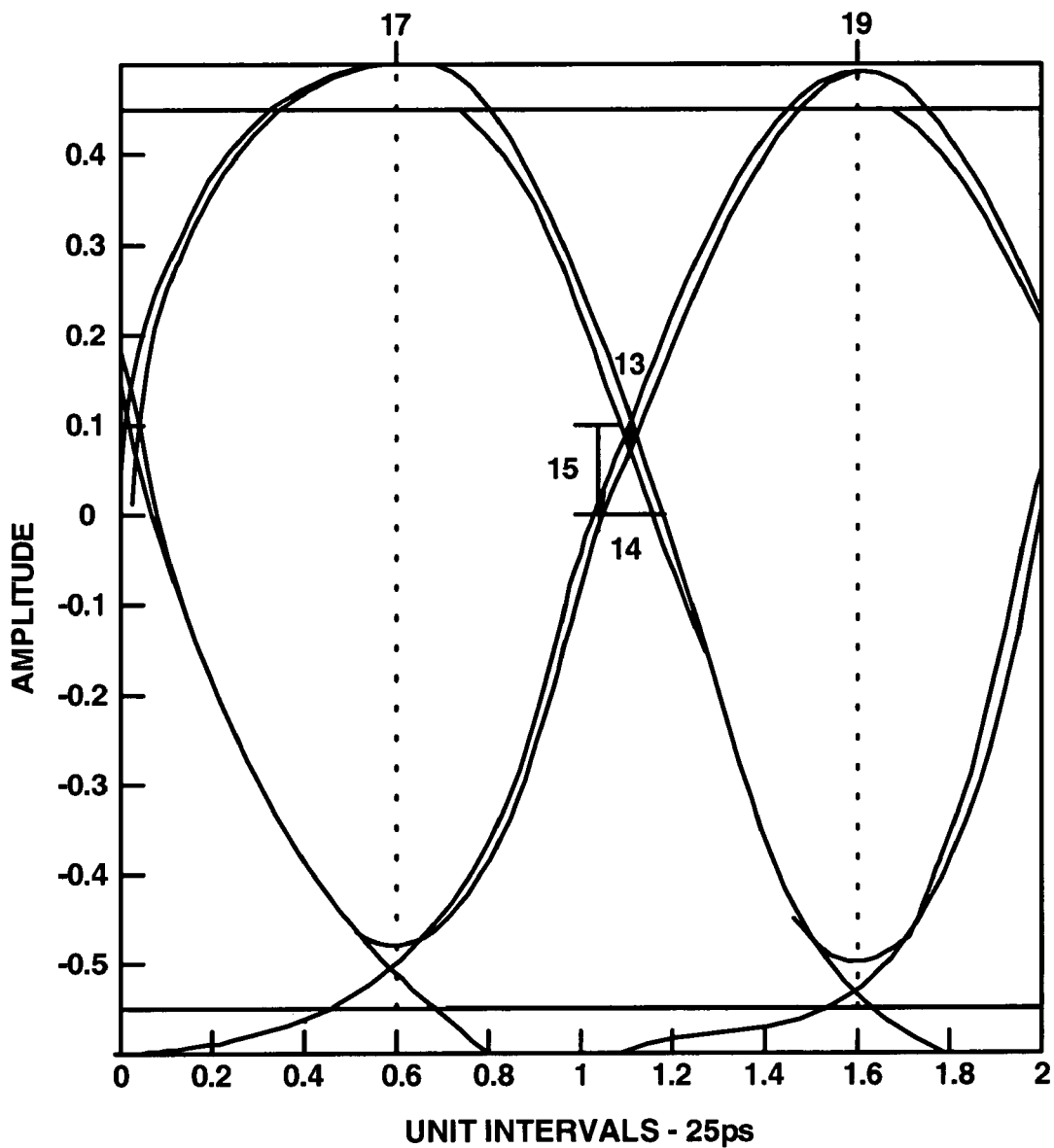
FIG. 2 illustrates a data-eye diagram with duty-cycle distortion.

As an example, the cross point shown in FIG. 2 is offset to approximately an amplitude of 0.09, therefore the average value of transition samples in the wandering interval 14 is a positive value and greater than the default starting threshold 0.

Moreover, the output of the integrator block 4 is delayed one cycle in a delay block 6 and then used as the new threshold input 39 for the next comparison in the comparator 37, and the process to locate the cross point restarts with the new threshold 39. For the example shown in FIG. 2, the phase detector searches for the cross point at incrementally higher amplitudes with each new threshold value 39. The increment or decrement amount depends on the scale factor in the integration equation, which is set as 0.0001 for the embodiment shown in FIG. 3.

Figure 4:
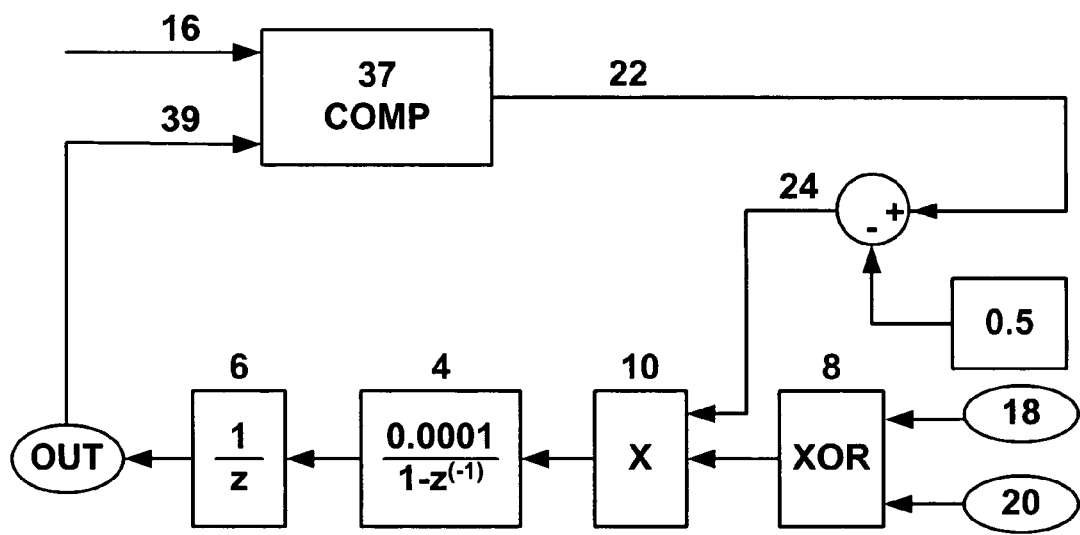
FIG. 4 illustrates a second embodiment of the present invention including transition detection.

FIG. 4 illustrates a set-threshold circuit 200 as a second embodiment of the present invention, comprising: a comparator 37 with two inputs 16 and 39 and an output 22, a XOR function block 8 with two inputs 18 and 20, a multiplication block 10, an integrator block 4, and a unit delay block 6.

In addition to the integration and shifting to find a cross point in a data-eye diagram, the second embodiment performs the integration step only when data transitions are present in order to eliminate threshold drift during long periods of data sequences without transitions.

The values 18 and 20 are binary results of comparing 0 to sample values taken at data-eye centers, with respect to the location of the wandering interval sample 16. If the values 18 and 20 differ, indicating a transition in the data-eye diagram, the multiplier 10 multiplies 1 with the quantized value 24, allowing the integration to proceed. Conversely, if the values 18 and 20 are equal, indicating a data sequence without transitions, the multiplier 10 multiplies 0 with the quantized value 24 and effectively eliminates the integration step.

Furthermore, since the samples 18 and 20 are located with reference to the location at which sample 16 is taken, the accuracy of the locations for the samples 18 and 20 is improved as the phase detector gradually shifts the amplitude at which it samples 16 towards the desired cross point.

Figure 5:
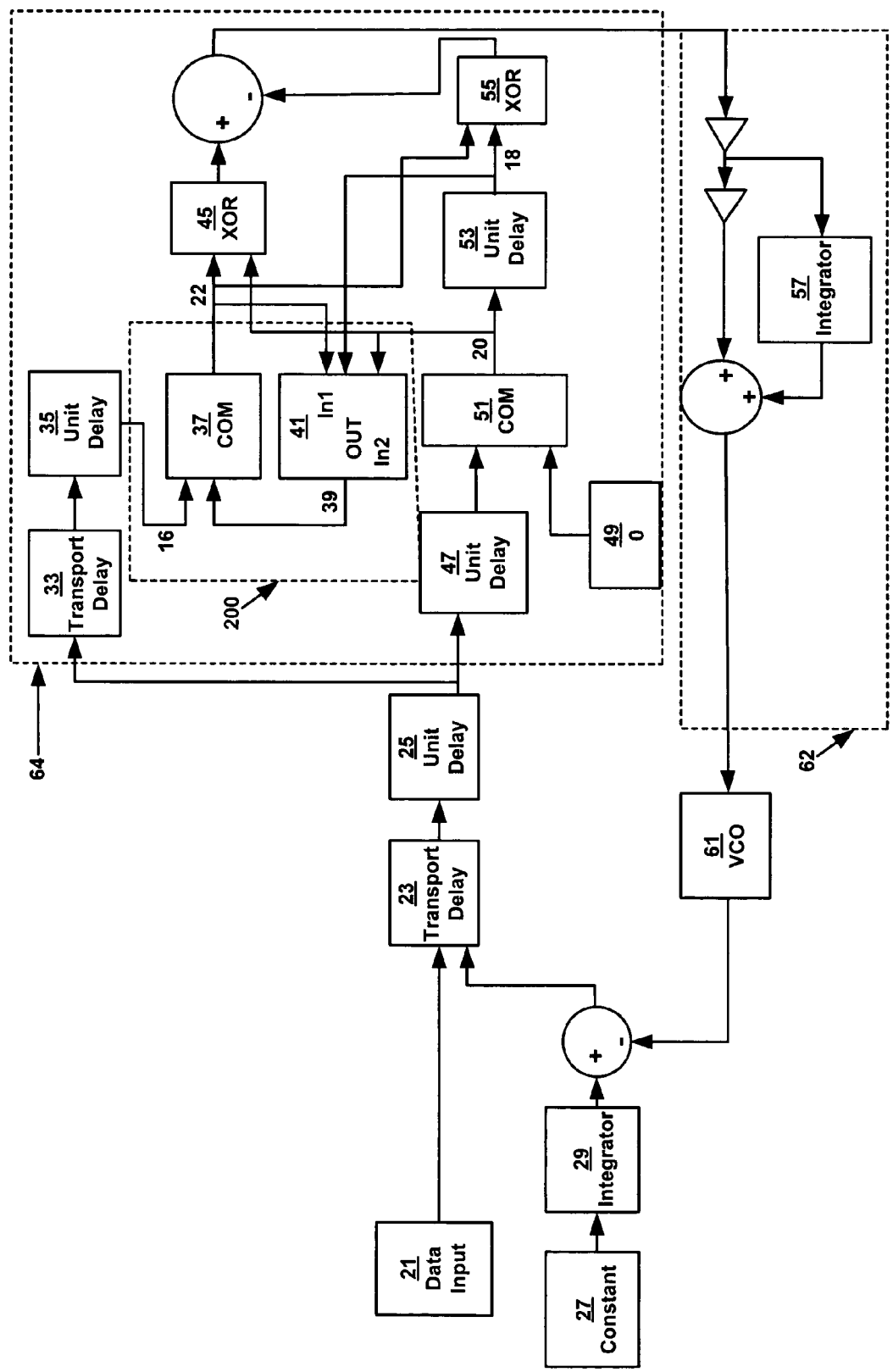
FIG. 5 illustrates the second embodiment of the present invention as implemented in a clock data recovery circuit.

FIG. 5 shows the second embodiment of the present invention implemented as part of an Alexander phase detector based clock data recovery circuit. The clock data recovery circuit in FIG. 5 comprises the basic elements of a PLL, including: an Alexander phase detector denoted 64, a filter denoted 62, and a VCO denoted 61.

As shown in FIG. 5, data inputs are received at block 21. The sample taken at the center of a first eye is first received in the circuit, and subsequently compared to 0 as illustrated by blocks 49 and 51. The resulting signal 20, whose value is either 0 or 1, is delayed one cycle and then released at the output of block 53 as signal 18.

Referring to FIG. 5 in view of FIG. 2, a sample 16 is taken in the wandering interval 14, and the sample value is compared to a threshold input 39 whose initial value is set as 0. The resulting signal 22 of the comparison, whose value is either 0 or 1, is the output of the comparator block 37.

As the sample signal 16 is processed, a third sample taken at the center of a second eye is received in the circuit, and subsequently compared to 0 as illustrated by blocks 49 and 51. The resulting signal 20, whose value is either 0 or 1, is the output of the block 51. Subsequently, the signals 22, 18, and 20 are inputs to the circuit 41, whose components are explicitly illustrated in FIG. 4.

As shown by blocks 41 and 37, the output 39 of the circuit 200 is the new threshold input for comparison with the wandering interval sample 16. Moreover, the comparison process continues with all three sample-points as the phase detector adjusts the sampling threshold through the integration performed in the circuit 41. Since the wandering interval sample 16 is used as a reference to locate the data-eye centers 18 and 20, as the phase detector adjusts the sampling amplitude to locate the cross point, it consequently adjusts the locations at which the samples 18 and 20 are taken and effectively allows the phase detector to self-center.

As illustrated in FIG. 5, the circuit also includes a constant block 27 that feeds into an integrator block 29, the output of which is combined with the output of VCO 61 to produce a result. This result, along with data input 21, is input to a transport delay block 23 and a unit delay block 25. From unit delay block 25, the signal branches to unit delay block 47, which outputs to comparator block 51, and to transport delay block 33, which outputs to unit delay block 35 that in turn outputs to comparator block 37.

The circuit of FIG. 5 also includes an XOR block 45 that receives signals 20 and 22 as inputs, and an XOR block 55 that receives signals 18 and 22 as inputs.

Figure 6:
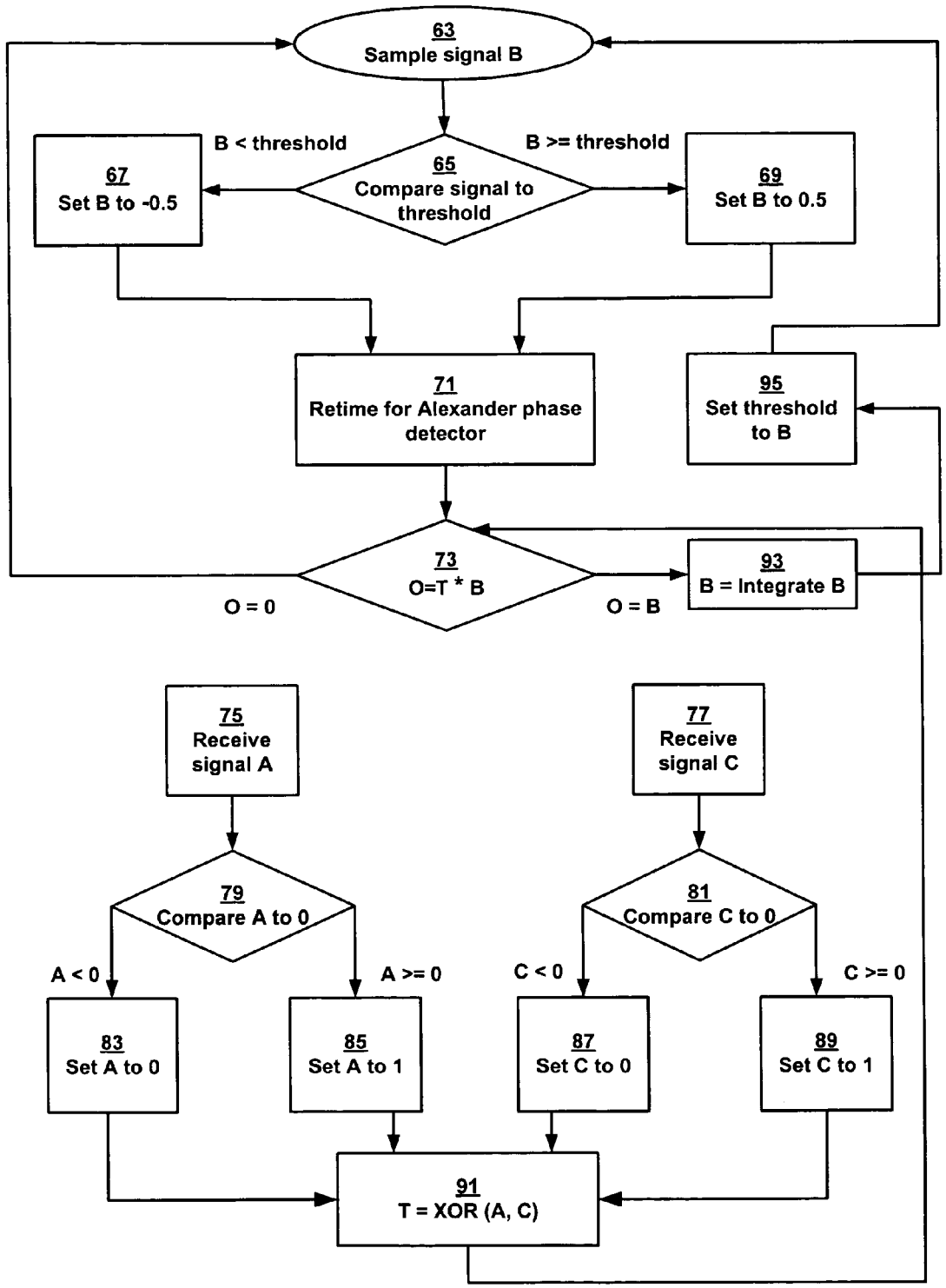
FIG. 6 illustrates a flow diagram for one embodiment of the present invention.

FIG. 6 is a flow diagram illustrating a method for eliminating dead zone using a binary quantized phase detector according to one embodiment of the present invention. Step 63 shows that a signal B in the wandering interval is sampled and compared to a threshold value (step 65). If the value of B is less than the threshold value, B is set to −0.5 (step 67); if the value of B is greater than or equal to the threshold value, B is set to 0.5 (step 69) as shown in FIG. 4.

A delay is then inserted to retime the Alexander phase detector in step 71. While the signal B is processed, two other signals A and C are sampled in steps 75 and 77 at the center of the eyes before and after B, using B as a reference mid-point location.

Both samples A and C are subsequently compared to 0 in steps 79 and 81. If the value of either signal is less than 0 (zero), the signal is set to 0 (steps 83, 87); otherwise, the signal is set to 1 (steps 85, 89). Step 91 then applies an XOR function to the resulting signals A and C to determine if a data transition has occurred in the interval between the two sample points.

Step 91 shows that a temporary variable T holds the result of the XOR function; if a transition exists in the data sequence, T equals 1; else T equals 0. T is then multiplied with the value of B in step 73 to determine whether integrating the value of B is necessary.

If the output O of step 73 is 0 (zero), the integrating step is overlooked, and the phase detector restarts the sampling process for all three signals. If the output O of step 73 is 1, the value of B is integrated in step 93, and the result is set as the new threshold for the phase detector (step 95).

Although the invention has been described in connection with several embodiments, it is understood that this invention is not limited to the embodiments disclosed, but is capable of various modifications that would be apparent to a person skilled in the art.

For example, the Alexander phase detector and the XOR function shown in the figures are intended as illustrations, other binary quantized phase detectors and means to determine if two values are equal may be used in conjunction with the present invention without departing from the spirits of the present invention. Moreover, the multiplication block 10 in FIG. 4 may be replaced with other means such as a table look up or a gain stage, to filter out the wandering interval sample.

It is understood that common practice such as representing binary values with "0" and "1" or TRUE and FALSE may be implemented by various means without departing from the desired representation.

Temporary variables shown in FIG. 6 such as T and O are used to clarify the details of the embodiment and may not be necessary in actual implementation.

Furthermore, constants such as 0.5 used in FIG. 2 and FIG. 3 to level shift the input signal so that its mean value is zero, may be replaced by other constants, the comparisons may substitute its operators such as >= to >, the default threshold value 0 for block 39 may be altered, and the scale factor for the integrator may be adjusted to desired precision requirements without altering the essence of the present invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the arts to best utilize the invention and various embodiments with various modifications as are suited to the particular use contemplated. It is intended that the scope of the invention be defined by the claims appended hereto and their equivalents.

We claim:

1. A phase locked loop having a binary quantized phase detector, comprising:
   a first means for storing a reference threshold value;
   a comparator having a first input for receiving a first input signal and a second input for receiving the reference threshold value, the comparator comparing the first input signal with the reference threshold value to generate an output; and
   a set threshold block, comprising:
      a second means for generating a constant value for level shifting the output from the comparator to produce an output whose value is 0; and
      an integrator, coupled to the second means, for locating a cross point in a data-eye diagram of a data sequence, having an input for receiving the output from the comparator and an output for generating a new threshold value;
   a third means for filtering the output of the second means, having a first input for receiving the quantized output and an output coupled to the integrator; and
   a fourth means for determining if two values are not equal, having a first input for receiving a first input signal, a second input for receiving a second input signal, and an output coupled to a second input of the third means.

2. The phase locked loop of claim 1, wherein the output of the second means is coupled to the input of the integrator.

3. A method for eliminating dead zone in a binary quantized phase detector, comprising:
   referencing a reference data sample to locate a center of a first eye in a data-eye diagram;
   receiving a first signal for a first data sample in the first center of the first eye;
   receiving a second signal for a second data sample in a wandering interval caused by a dead zone;
   using the reference data sample to locate a center of a second eye in the data-eye diagram;
   receiving a third signal for a third data sample in the center of the second eye;
   applying a first comparison to a value of the second signal and a reference threshold value;
   applying a second comparison to a value of the first signal and a first reference constant;
   applying a third comparison to the value of the third signal and a second reference constant; and
   applying a function to a result of the second comparison and the third comparison, determining if the two comparison results are equal.

4. The method of claim 3, wherein the two comparison results differ.

5. The method of claim 4, further comprising: after applying the function, integrating the output result of the first comparison.

6. The method of claim 5, further comprising: after the integrating step, setting the second signal as the new reference data sample.

7. The method of claim 5, further comprising: after the integrating step, setting the result of the integration as the new reference threshold value.

8. The method of claim 7, comprising: after the reference setting steps, restarting with the new reference data sample and reference threshold value.

9. The method of claim 3, wherein the two comparison results are equal.

10. The method of claim 9, further comprising: after applying the function, setting the second signal as the new reference data sample.

11. The method of claim 10, comprising: after the reference setting step, restarting with the new reference data sample.

12. The method of claim 3, wherein the first comparison step produces an output whose average value is not 0.

13. The method of claim 12, further comprising: after applying the first comparison, level shifting the output of the first comparison to produce an output whose average value is 0.

* * * * *